United States Patent [19]
Liu

[11] Patent Number: 6,137,741
[45] Date of Patent: Oct. 24, 2000

[54] SENSE AMPLIFIER WITH CASCODE OUTPUT

[75] Inventor: Lin-Shih Liu, Fremont, Calif.

[73] Assignee: Winbond Electronics Corporation, Taiwan

[21] Appl. No.: 09/397,754

[22] Filed: Sep. 16, 1999

[51] Int. Cl.[7] .............................. G11C 7/02; G11C 16/06
[52] U.S. Cl. ...................... 365/208; 365/185.21; 327/51
[58] Field of Search .................... 365/207, 208, 365/185.21, 205; 327/51, 54

[56] References Cited

U.S. PATENT DOCUMENTS 5,189,322  2/1993  Chan et al. ........................ 307/530
5,394,037  2/1995  Josephson et al. ..................... 327/51
5,473,560  12/1995  Harada ................................. 365/104
5,894,439  4/1999  Nakamura .......................... 365/189.07
5,909,394  6/1999  Chou ................................. 365/185.21
5,995,421  11/1999  McKenny .......................... 365/189.07
5,999,454  12/1999  Smith ................................. 365/185.21

Primary Examiner—Son Mai
Attorney, Agent, or Firm—Townsend and Townsend and Crew LLP

[57] ABSTRACT

A sense amplifier circuit for a memory integrated circuit provides good performance and relatively low power consumption. The circuitry includes a cascode output and a feedback (214) from the cascode output to a transistor (M1) to provide additional pull-up current at a bit line (206).

78 Claims, 2 Drawing Sheets

SENSE AMPLIFIER WITH CASCODE OUTPUT

BACKGROUND OF THE INVENTION

The present invention relates to the field of integrated circuits, and more specifically to a sense amplifier circuit for a memory integrated circuit.

Memory integrated circuits such as DRAMs, SRAMs, EPROMs, EEPROMs, and Flash memories are used in many applications such as computers, networking, and telecommunications. Consumers continue to demand greater performance in their electronic products. For example, higher speed computers will provide higher speed graphics for multimedia applications or development. Higher speed internet web servers will lead to greater on-line commerce including on-line stock trading, book sales, auctions, and grocery shopping, just to name a few example. Higher performance memory integrated circuits will improve the performance of the products in which they are incorporated.

In particular, the speed of a memory integrated circuit depends on the internal propagation delays of signals within the circuit. An array of memory cells in a memory circuit is typically organized by rows and columns. By providing an address to the row decoders, a row decoder selects a particular row of memory cells. A sense amplifier for each column of the array determines whether a speed path propagation delay is determined in part by the time it takes for a decoder to access or drive a particular row. Furthermore, it is important that the voltages selected to interface with the array and other circuitry provides for reliable and proper operation of the integrated circuit.

As can be seen, techniques and circuitry for improving the performance of memory integrated circuits are needed.

SUMMARY OF THE INVENTION

The present invention provides techniques and circuitry for improving the performance of a memory integrated circuit. A sense amplifier of the invention has good performance and relatively low power consumption. The circuitry includes a cascode output and a feedback from the cascode output to a first transistor to provide additional pull-up current at a bit line. In an embodiment, this first transistor is a PMOS transistor. Compared to an NMOS transistor, the PMOS transistor will provide greater pull-up current capability especially as lower supply voltages are used. And the PMOS transistor will load the cascode output less since a smaller device can be used.

In an embodiment, the present invention is an integrated circuit including a bit line connected to a number of memory cells. These memory cells may be Flash or EEPROM devices. A first transistor is connected between a supply voltage and a first node. The transistor is a PMOS device. A second transistor is connected between the first node and the bit line. A third transistor is connected between a second node and the bit line. A buffer circuit is connected to the second node; the buffer circuit provides at an output line a logic state representative of a logic value stored in one of the memory cells. The buffer circuit can be implemented using a CMOS inverter.

The threshold voltage or VT of the second transistor is greater than the threshold voltage of the third transistor. One technique for obtaining this VT relationship in the invention is for a channel length of the second transistor is longer than a channel length of the third transistor. Both the channel lengths of the second and third transistor are less greater than a minimum channel length permitted by the process technology.

A voltage bias generator circuit is connected to gates of the second and third transistors. An embodiment of the voltage bias generator circuit includes a fourth transistor connected between the first supply voltage and the bias voltage line. A gate of the fourth transistor is connected to the bias voltage line. A fifth transistor is connected between the bias voltage line and a third node. A gate of the fifth transistor is connected to the voltage bias line. And, a sixth transistor is connected between the third node and a second supply voltage. A gate of the sixth transistor is connected to the third node.

In another embodiment the invention a sense amplifier having a first transistor connected between a first node and a bit line. A second transistor is connected between a second node and the bit line. Gates of the first and second transistors are connected together. A channel length of the first transistor is longer than a channel length of the second transistor. In a specific case, a ratio of the first transistor to the second transistor is at least about 1.25. Gate widths of the first and second transistor may be the same.

Other objects, features, and advantages of the present invention will become apparent upon consideration of the following detailed description and the accompanying drawings, in which like reference designations represent like features throughout the figures.

DETAILED DESCRIPTION

Figure 1:
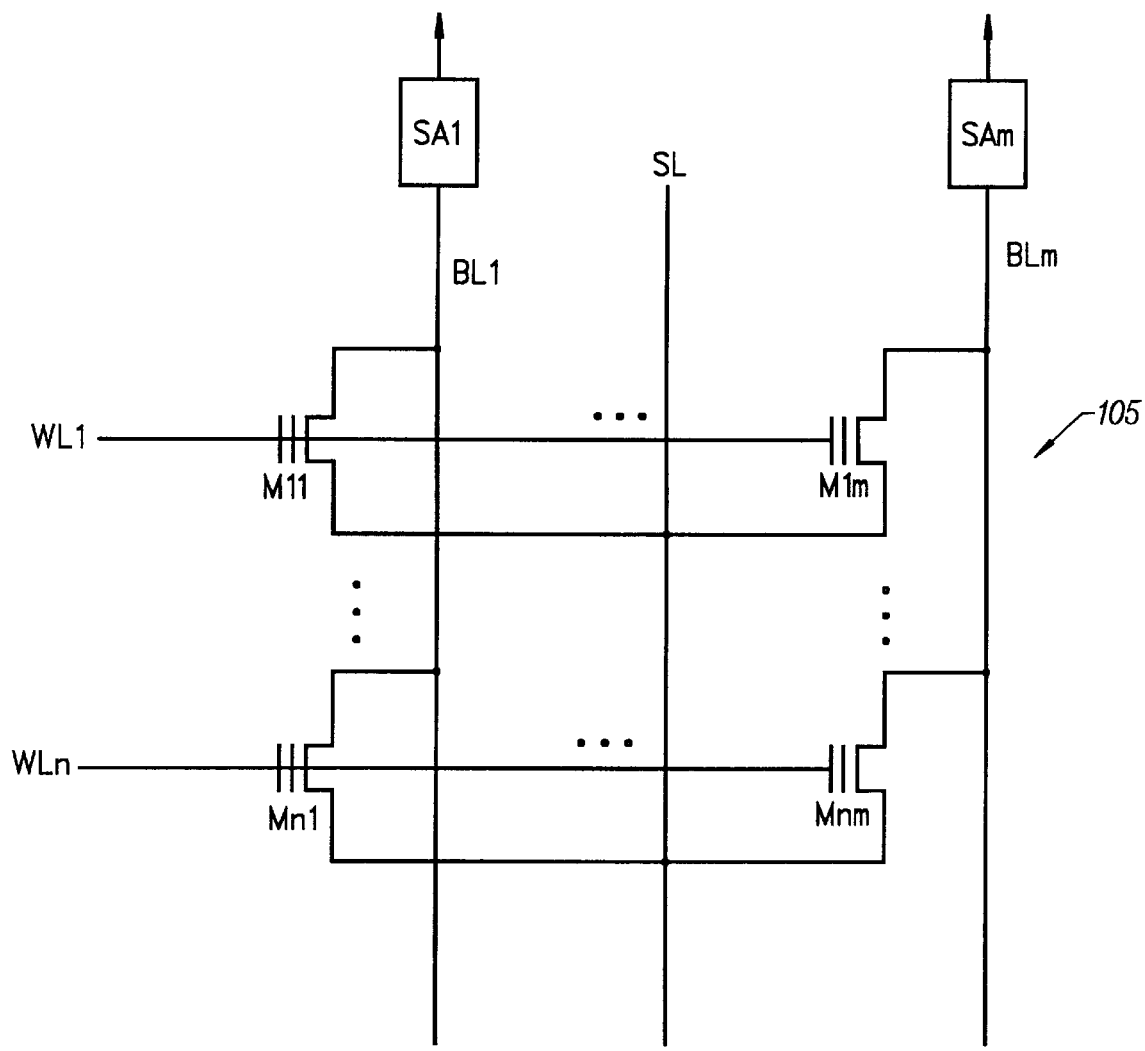
FIG. 1 shows an array of memory cells and sense amplifiers.

FIG. 1 shows a diagram of the array and sense amplifier components of a memory integrated circuit. This figure does not show all the details of the memory integrated circuit, but shows the components useful for understanding the invention.

The memory integrated circuit includes an array 105 of n by m memory cells. These memory cells store binary information. For example, each memory cell may store a "1" or a "0" logical value. In alternative embodiments, a single memory cell be used may store more than two logical states; for example, these states may include a "00," "01," "10," or "11." It should be noted in the design of high performance memories, it may be desirable to split up the memory cells to form a number of arrays of memory cells.

Memory cells may be formed using transistors (for an SRAM); capacitors (for a DRAM); EPROM, EEPROM, or Flash cells (for an EPROM, EEPROM, or Flash memory, respectively), or one of the many other memory devices used to form memory cells in semiconductor processes. EPROM, EEPROM, and Flash cells are nonvolatile devices, so that the stored data is retained even when power is removed from the integrated circuit.

In a specific embodiment of the invention, the memory cells are floating gate devices such as an EPROM, EEPROM, or Flash cells. High voltages are used in the reading and writing of the memory cells. Floating gate memory cells are typically imprinted (i.e., programmed and erased) using Fowler-Nordheim tunneling or source-side injection by hot electrons, or combinations of these.

In FIG. 1, the memory array is arranged in rows and columns of memory cells. Each row of memory cells has a word line (WL) and a bit line (BL). The word line is also sometimes referred to as a row line (RL) or product term (PT) line. Specifically, gate connections for a row of memory cells M11 to M1m are connected by a word line WL1. Drain connections for a column of memory cells M11 to Mn1 are connected to a bit line BL1. In this implementation, source connections of the memory cells are connected to a common source line SL.

Individual rows in the memory array are selected by using row decoders and an address. By using a unique address, a particular row decoder selects a particular row of memory cells in the array to read or write, or perform some other desired operation. The data stored in a memory cell is determined using a sense amplifier. There is typically one sense amplifier circuit SA1 to SAm for each bit. For example, if the memory is "x8" or "by 8," this means the word size is 8 bits. Then, there will be eight sense amplifiers. A particular memory cell is selected by placing a high voltage on the appropriate word line. The unselected memory cells are deselected by placing a low voltage on the unselected word lines.

The sense amplifier detects the logic state stored in the memory cell and outputs a logic high or logic low. This information is then passed through a data path to the output of the integrated circuit. Since the sense amplifier is in the speed path of the memory integrated circuit, it is important that the sense amplifier have good performance characteristics. Generally, as the speed of the sense amplifier improves, the speed of the memory integrated will also improve.

Another important consideration for the sense amplifiers is that these circuits should provide good performance while at the same time consume as little power as needed. During the normal operation of a memory integrated circuit such as a Flash EPROM, the sense amplifier are circuitry on that consume a relatively large percentage of the power. If the power consumption of the sense amplifiers is reduces, the entire power consumption of the integrated is reduced.

Figure 2:
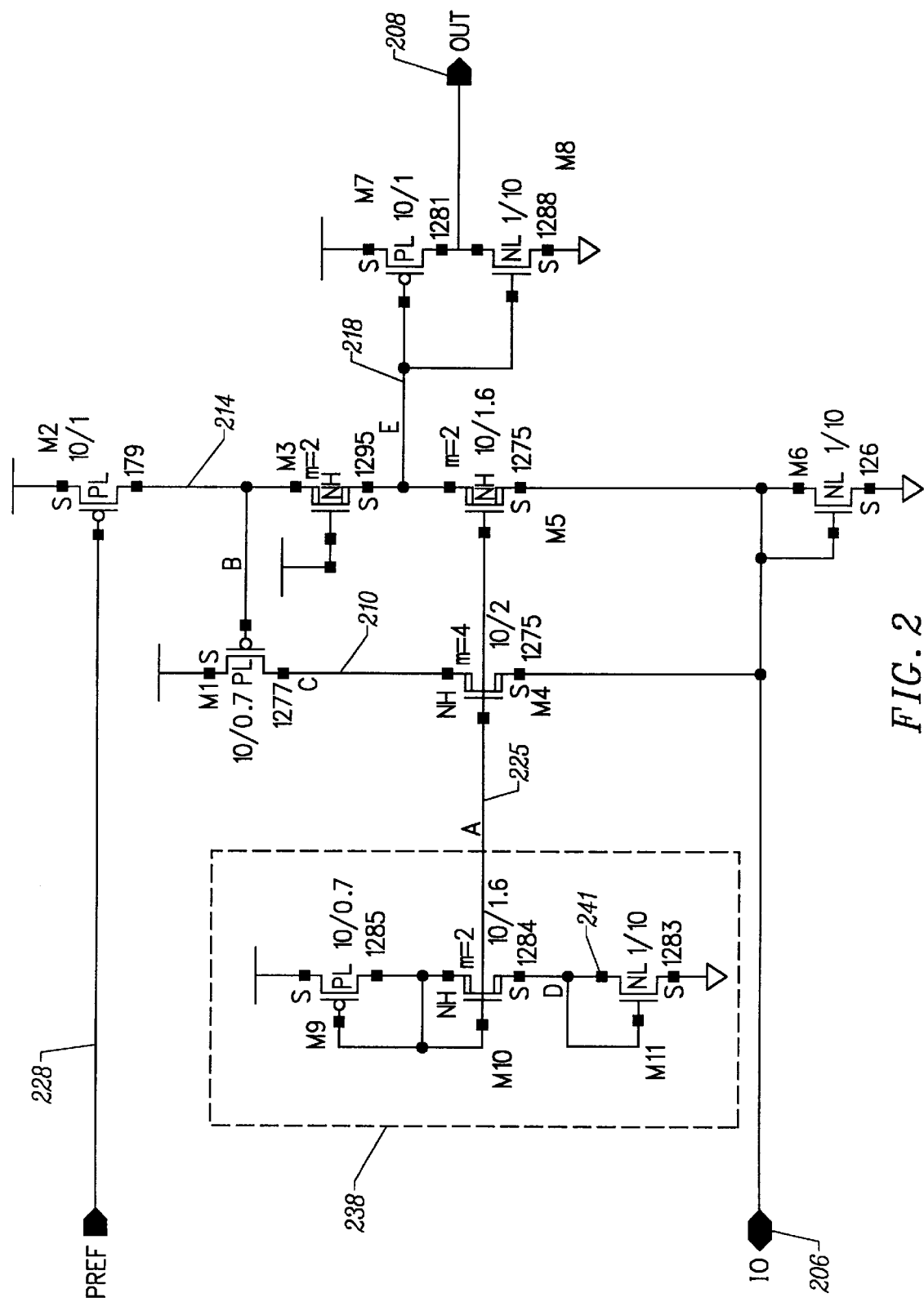
FIG. 2 shows a sense amplifier circuit.

FIG. 2 shows a sense amplifier circuit of the present invention. An I/O line 206 is an input to the sense amplifier and is connected to a bit line of the array of memory cells. An output OUT 208 is an output of the sense amplifier. Logic low or logic high is output at OUT 208 depending on what is stored in the selected memory cell.

The sense amplifier includes a transistor M1 connected between a positive supply voltage VDD or VCC and a node 210. A transistor M4 is connected between node 210 and I/O 206. A transistor M2 is connected between VDD and a node 214. Transistor M3 is connected between node 214 and a node 218. A transistor M5 is connected between node 218 and I/O 206. A transistor M6 is connected between I/O 206 and ground or VSS.

Control electrodes of transistor M4 and M5 are connected to a first bias voltage line 225. A control electrode of transistor M2 is connected to a second bias voltage line PREF 228. A control electrode of transistor M1 is connected to node 214. A control electrode of transistor M3 is connected to VDD. A control electrode of transistor M6 is connected to I/O 206. Transistor M6 is also known as a diode-connected transistor because the operating characteristics for this configuration is similar to a diode.

An input of a CMOS inverter including transistor M7 and M8 is connected at node 218. An output of the inverter produces OUT 208. Other embodiments of the invention can use other configurations for this inverter including depletion load, NMOS load, and others.

In the implementation of FIG. 2, the transistors are MOSFET transistors, each of which has drain, gate, source, and substrate connection. Transistors M1, M2, and M7 are PMOS transistors. Transistors M3, M4, M5, M6, M7, and M8 are NMOS transistors. Substrate connections for the PMOS transistors will typically be connected to VDD. Substrate connections for the NMOS transistors will typically be connected to VSS or the voltage level of substrate of the integrated circuit, which may be negative in the case of a back-biased substrate.

For a specific implementation, the sizes of the transistors are shown in the figure. For example, transistor M1 is 10/0.7 which means it has a width is 10 microns and a channel length of 0.7 microns. For the particular technology of the implementation in FIG. 2, the minimum channel length permitted is 0.7 microns. Transistor M2 is 10/1, transistor M3 is 10/1.6, transistor M4 is 10/2, transistor M5 is 10/1.6, and transistor M6 is 1/10. Transistor M7 is 10/1 and transistor M8 is 1/10.

A bias generator 238 generates the first bias voltage 238. The bias generator includes a PMOS transistor M9 connected between VDD and node 225. A gate of M9 is connected to node 225. A transistor M10 is connected between node 225 and a node 241. A gate of transistor M10 is connected to node 225. A transistor M11 is connected between node 241 and VSS. A gate of transistor M11 is connected to node 241. In an implementation, the first bias voltage 225 will be at a voltage level of about (VDD−VTP) volts. VTP is the VT or threshold voltage of a PMOS transistor.

It is not necessary to repeat the circuitry is box 238 for each sense amplifier. One bias generator may be used for a number of sense amplifiers. This will save space on the integrated circuit. Other configuration for a bias voltage generator may also be used.

A bias generator to generate PREF 228 may be similar to what is shown in box 238. In an implementation, the voltage level of PREF 228 will be about (VDD−VTP) volts.

In operation, PREF is the reference voltage for M2 which provides the sense amplifier pull-up or trip current. In an implementation, the voltage level of PREF 228 is selected so the current through transistor M2 will be about half a pull-up current through the unprogrammed memory cell. This current through an unprogrammed memory cell is sometimes referred to as Icell or cell current. The current through transistor M2 can be referred to as the pull-up current of the sense amplifier. For example, if the cell current is approximately 50 microamps, PREF is selected so the pull-up current of the sense amplifier is about 25 microamps.

The sense amplifier has a window of operation at input I/O 206. When the bit line is high, I/O 206 will sit at the upper edge of this window. When the bit line is low, I/O 206 will sit at the lower edge of the window. A switch threshold of the sense amplifier is between edges of the window of the sense amplifier. With a voltage above the threshold, OUT 208 will be low. With a voltage below the threshold, OUT 208 will be high.

When the selected memory cell is programmed, the memory cell will sink essentially zero current. I/O 206 will be at a voltage level determined by the pull-up of the sense amplifier and the current sunk by transistor M6. Nodes 214 and 218 will be pulled up to the upper edge of the window of the sense amplifier. OUT 208 will be low.

When the selected memory cell is erased, the sense amplifier pull-up current is sunk by selected memory cell connected to I/O 206. Nodes 214 and 218 will be pulled down to the lower edge of the window of the sense amplifier. OUT 208 will be high.

Furthermore, when node 214 is low, this is fed back to the gate of transistor M1 to turn this transistor on more. The current of through transistors M1 and M4 will increase to prevent I/O 206 from dropping to too low a voltage level. This will limit the swing on I/O 206 and will increase the speed of the sense amplifier. This reduces the size of the window of the sense amplifier. The less the voltage swing between a high and low at I/O 206, the faster the sense amplifier will be because less time is required when making a smaller voltage transition. Transistor M1 precharges I/O 206 or the bit line to provide greater current capability than the pull-up current of M2 alone. This greater current capability will make the transition from low to high at I/O 206 faster. And, the transition from high to low at OUT 208 will also be faster.

Therefore, the sense amplifier provide good performance by using feedback to provide additional pull-up current when I/O 206 is low to speed up transitions. Moreover, in an implementation, M1 is a PMOS transistor. Although an NMOS transistor may also be used, there are advantages to using a PMOS transistor. Supply voltages VDD for integrated circuit are being reduced from 5 volts to 3.3 volts, and to even lower voltages in the future. With reduced supply voltages, a PMOS transistor will provide greater pull-up current than an NMOS transistor. With a lower supply voltage, this reduces the VDS across transistor M1.

For example, I/O 206 will typically be around 1.5 volts. A voltage of 1.5 volts or above is preferable at I/O 206 because it will provide better performance since the cell current of the memory cell will be greater. When I/O 206 is less than 1.5 volts, the performance will decrease because the cell current of the memory cell will be less. When I/O 206 is 1.5 volts and VDD is about 3 volts, there will be about 1.5 volts across transistor M1. For an NMOS transistor under these conditions, as the voltage of I/O 206 increases, the NMOS transistor will provide less current because its VGS is decreasing. VGS for an NMOS transistor is measured between the gate of M1 and I/O 206. In contrast, for a PMOS transistor, the pull-up current of M1 will remain relatively constant as I/O 206 increase. This is due in part because the VGS of a PMOS device will be constant regardless of a level at I/O 206. VGS for a PMOS transistor is measured between a gate of M1 and VDD. This will increase the speed of the sense amplifier of the invention.

Furthermore, using a PMOS transistor for M1 will provide greater current capability than using a similarly sized NMOS transistor. Thus, when using PMOS, a smaller sized M1 device can be used. This reduces the capacitive loading on node 214 and further increases the speed of the sense amplifier.

This sense amplifier uses a cascode output. Transistors M2 and M3 form the upper portion of the cascode output, and transistors M5 and M6 form the lower portion. Transistors M4 and M5 are similar device types so that they will track with process and other changes. The devices will skew similarly as the result of process variations. In the FIG. 2 implementation, both M4 and M5 are NMOS transistors. Also, the sizes of transistors M4 and M5 are selected to be similar to allow tracking. Both M4 and M5 have transistor widths of 10 microns.

The threshold voltage (VT) of transistor M4 is designed to be slightly higher than that of transistor M5. As I/O line 206 charges up, M4 begins to turn off before transistor M5. This ensures I/O 206 will stop before the window edge of the sense amplifier. If the I/O 206 goes above the upper window edge, it is possible the sense amplifier will oscillate, which is undesirable. By adjusting the VT of transistor M4 to be higher than transistor M5, this will prevent oscillation.

There are many different techniques of adjusting the VT of a transistor. This can be done by doping or using different device types. For example, transistor M5 or M4 may be selectively doped or implanted differently so the VT of transistor M4 will be greater. A specific technique to increase VT used in FIG. 2 is to adjust the channel length of transistor M4 to be slightly longer than transistor M5. The channel length of M4 is 2 microns while that of transistor M5 is 1.6 microns. A ratio of the channel lengths of M4 to M5 is 1.25. A greater ratio would generally provide an even greater VT difference between M4 and M5. Note that both transistors M4 and M5 have channel lengths greater than the minimum channel length of 0.7 microns. This improves the stability and performance of the sense amplifier with process variations.

The cascode output provides high gain, but only uses a pull-up current of about half of Icell. Further, the high and low voltages at node 218 are selected to ensure the inverting buffer of M7 and M8 does not have large current consumption. Using this design considerations, the sense amplifier of the invention will consume less power and at the same time provide excellent performance.

This detailed description has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. Others skilled in the art will be able to best utilize and practice the invention in various embodiments and with various modifications as are needed for a particular application. It is intended that the scope of the invention be defined by the following claims.

What is claimed is:

1. An integrated circuit comprising:
    a bit line coupled to a plurality of memory cells;
    a first transistor coupled between a first supply voltage and a first node, wherein the first transistor is a PMOS device;
    a second transistor coupled between the first node and the bit line;
    a third transistor coupled between a second node and the bit line; and
    a buffer circuit coupled to the second node, wherein the buffer circuit provides at an output line a logic state representative of a logic value stored in one of the memory cells.

2. The integrated circuit of claim 1 wherein the buffer circuit comprises a CMOS inverter.

3. The integrated circuit of claim 1 wherein gates of the second and third transistors are coupled together.

4. The integrated circuit of claim 1 wherein the buffer circuit comprises:
    a fourth transistor coupled between the first supply voltage and the output line, wherein the fourth transistor is a PMOS device and has a gate coupled to the second node; and
    a fifth transistor coupled between the output line and a second supply voltage, wherein the fifth transistor is an NMOS device and has a gate coupled to the second node.

5. The integrated circuit of claim 1 wherein gates of the second and third transistors are coupled to a bias voltage line.

6. The integrated circuit of claim 1 wherein the memory cells are floating gate memory cells.

7. The integrated circuit of claim 1 wherein a channel length of the second transistor is longer than a channel length of the third transistor.

8. The integrated circuit of claim 1 further comprising:
a fourth transistor coupled between the first supply voltage and a third node; and
a fifth transistor coupled between the third node and the second node, wherein a gate of the first transistor is coupled to the third node.

9. The integrated circuit of claim 8 further comprising:
a sixth transistor coupled between the bit line and a second supply voltage, wherein a gate of the sixth transistor is coupled to the bit line.

10. The integrated circuit of claim 8 wherein a gate of the fourth transistor is coupled to a first bias voltage.

11. The integrated circuit of claim 10 wherein a gate of the second transistor and a fourth gate of the third transistor are coupled to a second bias voltage.

12. The integrated circuit of claim 5 further comprising:
a voltage bias generator circuit coupled to the bias voltage line, wherein the voltage bias generator circuit comprises:
a fourth transistor coupled between the first supply voltage and the bias voltage line, wherein a gate of the fourth transistor is coupled to the bias voltage line;
a fifth transistor coupled between the bias voltage line and a third node, wherein a gate of the fifth transistor is coupled to the voltage bias line; and
a sixth transistor coupled between the third node and a second supply voltage, wherein a gate of the sixth transistor is coupled to the third node.

13. The integrated circuit of claim 1 wherein the second and third transistors are NMOS devices.

14. The integrated circuit of claim 8 wherein a gate of the fifth transistor is coupled to the first supply voltage.

15. The integrated circuit of claim 8 wherein the fourth transistor is a PMOS device.

16. The integrated circuit of claim 1 wherein a threshold voltage of the second transistor is higher than a threshold voltage of the third transistor.

17. A sense amplifier comprising:
a first transistor coupled between a first node and a bit line;
a second transistor coupled between a second node and the bit line, wherein gates of the first and second transistors are coupled together and a channel length of the first transistor is longer than a channel length of the second transistor.

18. The sense amplifier of claim 17 wherein a threshold voltage of the first transistor is greater than a threshold voltage of the second transistor.

19. The sense amplifier of claim 17 further comprising:
a third transistor coupled between a supply voltage and the first node.

20. The sense amplifier of claim 19 further comprising:
a fourth transistor coupled between a gate of the third transistor and the second node.

21. The sense amplifier of claim 19 wherein the third transistor is a PMOS device.

22. A Flash memory comprising a sense amplifier as recited in claim 17.

23. An EEPROM memory comprising a sense amplifier as recited in claim 17.

24. The sense amplifier of claim 21 wherein a voltage level of the supply voltage is 3.3 volts or less.

25. The sense amplifier of claim 17 wherein channel lengths of the first and second transistors are both greater than a minimum channel length.

26. A sense amplifier comprising:
a first transistor coupled between a first node and a bit line; and
a second transistor coupled between a second node and the bit line, wherein the first and second transistors are NMOS devices and gates of the first and second transistors are coupled together, and a channel length of the first transistor is longer than a channel length of the second transistor.

27. The sense amplifier of claim 26 wherein the first and second transistors have the same gate width.

28. The sense amplifier of claim 26 where a ratio of a channel length of the first transistor to a channel length of the second transistor is at least about 1.25.

29. The sense amplifier of claim 26 wherein a threshold voltage of the first transistor is greater than a threshold voltage of the second transistor.

30. The sense amplifier of claim 26 further comprising:
a third transistor coupled between a supply voltage and the first node.

31. The sense amplifier of claim 30 further comprising:
a fourth transistor coupled between a gate of the third transistor and the second node.

32. The sense amplifier of claim 30 wherein the third transistor is a PMOS device.

33. A Flash memory comprising a sense amplifier as recited in claim 26.

34. An EEPROM memory comprising a sense amplifier as recited in claim 32.

35. The sense amplifier of claim 32 wherein a voltage level of the supply voltage is 3.3 volts or less.

36. The sense amplifier of claim 26 wherein channel lengths of the first and second transistors are both greater than a minimum channel length.

37. The sense amplifier of claim 26 wherein a ratio of the first transistor to the second transistor is at least about 1.25.

38. A sense amplifier comprising:
a first transistor coupled between a first node and a bit line; and
a second transistor coupled between a second node and the bit line, wherein gates of the first and second transistors are coupled together, a channel length of the first transistor is longer than a channel length of the second transistor, and the first and second transistors have the same gate width.

39. The sense amplifier of claim 38 where a ratio of a channel length of the first transistor to a channel length of the second transistor is at least about 1.25.

40. The sense amplifier of claim 38 wherein a threshold voltage of the first transistor is greater than a threshold voltage of the second transistor.

41. The sense amplifier of claim 38 wherein the first and second transistors are NMOS devices.

42. The sense amplifier of claim 38 further comprising:
a third transistor coupled between a supply voltage and the first node.

43. The sense amplifier of claim 42 further comprising:
a fourth transistor coupled between a gate of the third transistor and the second node.

44. The sense amplifier of claim 42 wherein the third transistor is a PMOS device.

45. A Flash memory comprising a sense amplifier as recited in claim 38.

46. An EEPROM memory comprising a sense amplifier as recited in claim 38.

47. The sense amplifier of claim 44 wherein a voltage level of the supply voltage is 3.3 volts or less.

48. The sense amplifier of claim 38 wherein channel lengths of the first and second transistors are both greater than a minimum channel length.

49. The sense amplifier of claim 38 wherein a ratio of the first transistor to the second transistor is at least about 1.25.

50. A sense amplifier comprising:
a first transistor coupled between a first node and a bit line; and
a second transistor coupled between a second node and the bit line, wherein gates of the first and second transistors are coupled together, a channel length of the first transistor is longer than a channel length of the second transistor, and a ratio of a channel length of the first transistor to a channel length of the second transistor is at least about 1.25.

51. The sense amplifier of claim 50 wherein a threshold voltage of the first transistor is greater than a threshold voltage of the second transistor.

52. The sense amplifier of claim 50 wherein the first and second transistors are NMOS devices.

53. The sense amplifier of claim 50 further comprising:
a third transistor coupled between a supply voltage and the first node.

54. The sense amplifier of claim 53 further comprising:
a fourth transistor coupled between a gate of the third transistor and the second node.

55. The sense amplifier of claim 53 wherein the third transistor is a PMOS device.

56. A Flash memory comprising a sense amplifier as recited in claim 50.

57. An EEPROM memory comprising a sense amplifier as recited in claim 50.

58. The sense amplifier of claim 55 wherein a voltage level of the supply voltage is 3.3 volts or less.

59. The sense amplifier of claim 50 wherein channel lengths of the first and second transistors are both greater than a minimum channel length.

60. The sense amplifier of claim 50 wherein a ratio of the first transistor to the second transistor is at least about 1.25.

61. A sense amplifier comprising:
a first group of series-coupled transistors coupled between a first supply voltage and a bit line, wherein the first group comprises a first transistor and a second transistor;
a second group of series-coupled transistors coupled between the first supply voltage and the bit line, wherein the second group comprises a third transistor, a fourth transistor, and a fifth transistor, and
a third group of series-coupled transistors coupled between the first supply voltage and a second supply, wherein the third group comprises a sixth transistor and a seventh transistor, and gates of the sixth and seventh transistors are coupled to a first node together with the fourth and fifth transistors.

62. The sense amplifier of claim 61 wherein the first transistor is PMOS and has a gate coupled to a second node together with the third and fourth transistors,
wherein the second transistor is NMOS and has a gate coupled to a first reference voltage,
wherein the third transistor is PMOS and has a gate coupled to a second reference voltage,
wherein the fourth transistor is NMOS and has a gate coupled to the first supply voltage, and
wherein the fifth transistor is NMOS and has a gate coupled to the gate of the second transistor.

63. The sense amplifier of claim 61 wherein gates of the fifth and second transistors are coupled together.

64. The sense amplifier of claim 61 further comprising:
an eighth transistor coupled between the bit line and the second supply voltage.

65. The sense amplifier of claim 63 wherein the second transistor has a longer channel length than the fifth transistor.

66. The sense amplifier of claim 62 wherein the second transistor has a longer channel length than the fifth transistor.

67. The sense amplifier of claim 63 wherein a W/L ratio of the fifth transistor is larger than the second transistor.

68. The sense amplifier of claim 62 wherein a W/L ratio of the fifth transistor is larger than the second transistor.

69. The sense amplifier of claim 62 wherein a threshold voltage of the second transistor is larger than for the fifth transistor.

70. The sense amplifier of claim 63 wherein a threshold voltage of the second transistor is larger than for the fifth transistor.

71. The sense amplifier of claim 61 wherein the second and fifth transistors have channel lengths greater than a minimum channel length.

72. A sense amplifier comprising:
a first transistor coupled between a first node and a bit line; and
a second transistor coupled between a second node and the bit line, wherein gates of the first and second transistors are coupled together, a channel length of the first transistor is longer than a channel length of the second transistor, and a ratio of the first transistor to the second transistor is at least about 1.25.

73. The sense amplifier of claim 17 wherein the gates of the first and second transistors are coupled to a reference voltage.

74. The sense amplifier of claim 73 wherein the reference voltage is not a logic signal output.

75. The sense amplifier of claim 73 wherein the reference voltage is below a VCC voltage level and above a VSS voltage level.

76. The sense amplifier of claim 73 wherein the reference voltage represents neither a logic 0 nor a logic 1 value.

77. The sense amplifier of claim 73 wherein the reference voltage is not provided by an output of a logic gate.

78. The sense amplifier of claim 73 wherein the reference voltage is at a fixed voltage level that does not vary due to varying voltage level at the bit line.

* * * * *